United States Patent [19]
Burstein et al.

[11] Patent Number: 4,593,363
[45] Date of Patent: Jun. 3, 1986

[54] SIMULTANEOUS PLACEMENT AND WIRING FOR VLSI CHIPS

[75] Inventors: Michael Burstein, Carmel; Se J. Hong, Yorktown Heights; Richard N. Pelavin, Chappaqua, all of N.Y.

[73] Assignee: International Business Machines Corporation, Armonk, N.Y.

[21] Appl. No.: 522,900

[22] Filed: Aug. 12, 1983

[51] Int. Cl.<sup>4</sup> ............................................. G06F 15/20
[52] U.S. Cl. .................................... 364/491; 364/300
[58] Field of Search ............................. 364/491, 300

[56] References Cited

U.S. PATENT DOCUMENTS

| | | | |
|---|---|---|---|
| T938,005 | 9/1975 | Colton et al. | 364/300 |
| T940,013 | 11/1975 | Ho | 364/300 |
| T940,020 | 11/1975 | Brechling et al. | 364/300 |
| T944,001 | 3/1976 | Hanan et al. | 364/300 |
| 3,617,714 | 11/1971 | Kernighan et al. | 364/300 |
| 3,681,782 | 8/1972 | Scanlon | 364/300 |
| 3,705,409 | 12/1972 | Brayton et al. | 364/300 |
| 4,027,246 | 5/1977 | Caccoma et al. | 364/300 X |
| 4,377,849 | 3/1983 | Finger et al. | 364/300 X |
| 4,484,292 | 11/1984 | Hong et al. | 364/491 |
| 4,500,963 | 2/1985 | Smit et al. | 364/300 |

Primary Examiner—Edward J. Wise
Attorney, Agent, or Firm—George E. Clark; Jack M. Arnold; Thomas P. Dowd

[57] ABSTRACT

For designing the layout of a master-slice VLSI chip steps for placing components and for determining the wiring pattern interconnecting them are alternated in an iterative process. The chip area is partitioned into subareas of decreasing size, the set of components is partitioned into subsets which fit to the respective subareas, and after each partitioning step the global wiring is determined for the existing subnets of the whole network. Due to this interrelation of placement and wiring procedures, advantages with respect to total wire length, overflow number of wires, and processing time can be gained.

16 Claims, 13 Drawing Figures

SIMULTANEOUS PLACEMENT AND WIRING FOR VLSI CHIPS

TECHNICAL FIELD

This invention relates to the design of circuit structures which are to be accommodated on a substrate chip in VLSI technology. In particular, the invention is concerned with the placement of components or basic circuits of a network into subareas of the partitioned chip area, and with the global determination of wiring connections between these components or circuits, i.e., a determination of through which chip subareas and boundaries between them, each connecting "wire" (conducting line) passes. Generally, it is assumed that there are separate layers for horizontal and vertical wiring, and that vias are provided between the layers, each for interconnecting a horizontal and a vertical conducting line so that "bends" from horizontal to vertical directions are possible.

The components and circuits which are considered basic elements in the network may include single transistors, elementary logic gates, bistable circuits etc.

The invention is applicable to master-slice technology (sometimes referred to as "gate-array technology") which assumes the presence of a regular grid on the chip rectangle and possible positions for components are defined by cells of the grid.

BACKGROUND ART

Several approaches are known in the art of LSI circuit layout design for distributing the components of a network such that the available substrate area is well utilized and the placement of the components is advantageous for interconnecting them by conducting lines. Also known are several techniques for establishing a wiring pattern between given elements or circuits and the available input/output terminals on a substrate.

Some publications in this field disclose methods for partitioning a given surface and for assigning circuits or components that are to be accomodated to the dissected areas according to certain criteria. Representative articles are the following:

M. A. Breuer "Min-Cut Placement", Journal of Design Automation and Fault-Tolerant Computing, October 1977, pp. 343-362.

L. R. Corrigan "A Placement Capability Based on Partitioning", Proc. 16th DA Conference, June 1979, pp. 406-413.

These articles describe procedures for successively partitioning a given surface area by cut-lines into subsections of decreasing size and for then distributing or placing elements in such a way on both sides of each new cut-line that the number of signals which have to cross the cut-line is minimized. Advantages are gained for the subsequent design of the wiring pattern if the circuit elements are placed in this manner because the wiring length or density tends to be decreased. However, as the placement considers only specific local situations one at a time, the overall result of the final wiring process is not yet optimal.

For improving the design of the wiring pattern interconnecting elements that are already placed on a given-surface, suggestions were made in the following articles:

S. J. Hong, R. Nair, E. Shapiro "A Physical Design Machine" Proceedings International Conference VLSI-81, Edinburgh, August 1981, pp. 267 ff.

R. Nair, S. J. Hong, S. Liles, R. Villani, "Global Wiring on a Wire Routing Machine", Proc. 19th DA Conference, Las Vegas 1982, pp. 224-231.

The suggested procedures find best wiring routes between terminals of processing elements in a given placement distribution and thus help in designing a good wiring pattern. However, the influence of the initial element placement distribution on the subsequent wiring procedures is not considered so that an overall optimization may not be achieved.

An article entitled "Hierarchical Channel Router" by M. Burstein et al, was published in Vol. 1, No. 1 Integration 1983 and also in the Proceedings of the 20th Design Automation Conference at Miami Beach, 1983. The article disclosed a $2 \times n$ routing algorithm similar to the $2 \times n$ wiring algorithm which forms a part of the method of the present invention. However, the article did not disclose any method for placement of components or for wiring in a master-slice VLSI layout.

As will be seen from a consideration of the prior art, traditional approaches to VLSI layout design consist of two independent stages: (1) placement of components and (2) wire routing. Such approaches may not result in an appropriate optimum layout, even if powerful placement and wiring techniques are applied. One of the main disadvantages of traditional layout processes is that there are no known universal criteria for placement.

OBJECTS AND SUMMARY OF THE INVENTION

It is an object of the invention to provide a method for VLSI layout design in which the placement of components and the global wiring are well adapted to each other.

It is another subject of the invention to devise a method which provides simultaneous or interrelated placement and wiring layout in a single process.

A further object of the invention is to provide a combined placement and wiring method by which a shorter total wire length and lower overflow counts in the wiring can be achieved than with known procedures.

According to the present invention, placement and global wiring for a VLSI chip is obtained in iterative steps which include, subdividing the existing areas into smaller subareas and successively partitioning existing component sets into subsets for assignment to the subareas, along with the following successive additional steps: a placeability analysis to verify that assigned component subsets can be accommodated; a determination of the subnets that are cut by newly established boundaries; and a global wiring operation for each such subnet based on a specially devised algorithm for wiring within a $2 \times n$ grid, which is optimal and effective.

The foregoing and other objects, features and advantages of the present invention will be apparent from the following description of a preferred embodiment of the invention, as illustrated in the accompanying drawing.

BRIEF DESCRIPTION OF THE DRAWINGS

FIG. 9 (FIGS. 9.1 and 9.2) is a flow diagram of the 2×n wiring procedure.

DETAILED DESCRIPTION

(A) DEFINITIONS AND PRINCIPLES OF METHOD

In the following, some definitions of concepts which are used in the description are given. Thereafter, the principles and a survey of the steps of the invented method are explained.

Figure 1:
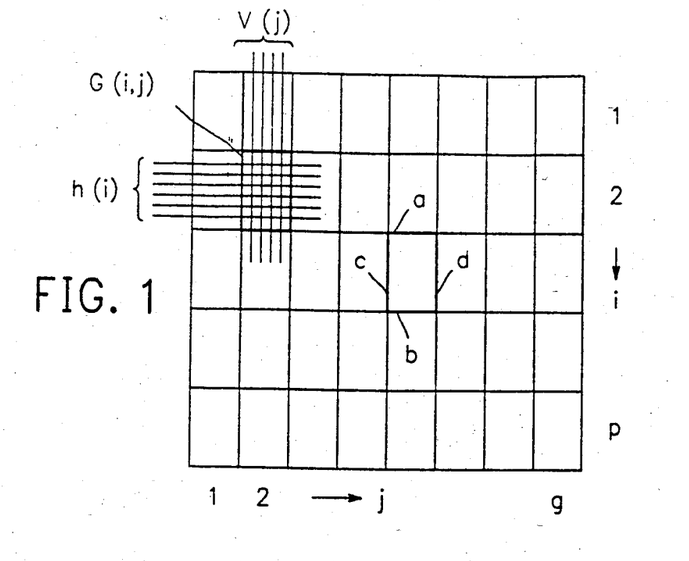
FIG. 1 shows the partitioning of a chip area into cells, and the horizontal and vertical wiring tracks crossing the boundaries of a cell.

(A1) Definitions (see also FIG. 1). The LSI chip area is assumed to be partitioned by parallel vertical and horizontal lines into a global grid, as it is customary in master-slice (gate-array) technology.

CELL: A cell is a rectangular portion of the LSI chip area. It is designated as $G(i,j)$ with i=row number, j=column number. The set of all available cells is designated as G or Gk (where k is the k-th partition level).

ELEMENTARY CELL: The smallest possible cell. The total chip area can be subdivided into a uniform array of p×q elementary cells.

SUPERCELL: A cell at an intermediate level of partitioning, which can be further subdivided, i.e., a cell comprising a plurality of elementary cells.

CELL GROUP: A group of 2×n cells. A cell group is generated when a horizontal row or vertical column of n cells is split lengthwise into 2n cells.

CELL BOUNDARY: A horizontal or vertical line segment between two cells, i.e. the edge or border line separating two cells.

WIRING TRACK: The path for a single separate conductor (wire). Each cell row or column can accommodate only a given maximum number of parallel wiring tracks. Each horizontal cell row i can carry $h(i)$ wiring tracks, and each vertical cell column j can carry $v(j)$ wiring tracks.

SUBSTRATE DATA: The quadruple (p, q, h, v), i.e. the number of rows and columns of elementary cells, and the number of wiring tracks per row and per column, completely describe a substrate or chip and is called the substrate data.

BLOCKED TRACK: A wiring track that is used for internal wiring in a cell when a circuit is assigned to it. Only the difference between the total number of wiring tracks and the number of blocked tracks, is available for external wiring crossing a cell boundary. For a cell $G(i,j)$, the number of horizontal blocked tracks is designated as $BLhx(i,j)$, and the number of vertical blocked tracks as $BLvx(i,j)$ when circuit x is assigned to it.

CHANNEL CAPACITY: The number of wiring tracks which are available to cross a horizontal or vertical cell boundary. It is equal to the full number of wiring tracks minus the number of blocked wiring tracks in either adjoining cell.

GLOBAL WIRING: The determination, on each level of partitioning and for each subnetwork of the total wiring network, through which cells and boundaries the respective subnetwork passes. Thus, global wiring indicates which conductors (wires) of the wiring network cross each cell boundary. The particular sequence or order of the parallel conductors on each cell boundary is not determined by global wiring but subsequently in a final wiring process (exact embedding).

SHAPE FUNCTION: For each circuit (component) x to b placed on a chip, the shape function $sh(x)=(a, b)$ indicates which rectangular array of a x b elementary cells must be provided for the circuit. For many circuits, the shape function is $sh(x)=(1, 1)$ i.e. they require only one elementary cell.

SUBNET: The whole network on a chip comprises a plurality of subnets. Each subnet consists of a subset of all circuits (components) plus their interconnections, which are treated as one ensemble, e.g. because they fulfill in combination a common function.

LEGAL POSITION: Certain circuits (components) cannot be placed arbitrarily in any cell, but only in selected cells (positions) of a chip which are called the legal positions. E.g., certain I/O circuits should only be placed in edge positions of a chip. The set of legal positions for a circuit x are designated as $LP(x)$. If $sh(x)=(1,1)$, $LP(x)$ is a set of top-left corner cells of admissible locations for x.

NET-LIST: The network obtained as a result of logical design comprises the set $X=[x(1), x(2), \ldots x(n)]$ of circuits (components) and the set $E=[e(1), e(2) \ldots e(m)]$ of subnets, where each subnet is identified with a subset of the set of circuits. The pair of sets (X, E) contains all the information about a logical network needed for global wiring. It can be stored as a list structure in computer storage and is referred to as the net-list.

PLACEMENT DATA: The functions $sh(x)$ (=shape function), $LP(x)$ (=set of legal positions), BLhx and BLvx (=number of horizontal and vertical blocked wiring tracks) for all circuits x constitute the placement data. They are already available before the actual placement is made.

PLACEABILITY ANALYSIS: This analysis tests whether an intended network distribution is correct, i.e. whether all circuits (components) of a circuit subset can be placed in legal positions of a supercell to which this circuit subset is assigned. If not, the intended partitioning must be modified.

(A2) Principles of Inventive Placement and Wiring Method

Starting from the whole chip surface area, the substrate is subdivided in sequential steps into smaller and smaller subareas (cells) and circuits or components to be accomodated on the chip are assigned to these subareas. This is a known placement principle.

However, instead of determining the wiring paths in a final procedure after circuit placement is fully completed, the present method provides a simultaneous solution of the placement and global wiring procedures. After each partitioning step of the iterative process, global wiring for the respective level of partitioning is determined. By this alternation of placement and global wiring steps, a much better adaptation of circuit distribution and wiring to each other and to the existing restrictions is possible, and the design of the total chip network can be done more smoothly.

The restrictions for circuit placement are circuit shape, legal positions, and requirements for internal wiring. The restrictions for wiring are the available channel capacity at each cell boundary, and the number of vias (interconnections) between horizontal and vertical wiring planes to enable wire bending) that can be accommodated in each cell.

The proposed method takes as input the following:
(a) SUBSTRATE DATA, i.e. the available number of elementary cell rows and columns, and of wiring tracks per row and column [p, q, h(i) for i=1 ... p, v(j) for j=1 ... q].
(b) NET-LIST, i.e. the list of components/circuits $X=[x(1) ... x(n)]$ to be placed, of subnets $E=[e(1) ... e(m)]$, and of their mutual assignments.
(c) PLACEMENT DATA, i.e. for each component-/circuit the allowed legal positions LP(x), the shape sh(x), and the numbers of wiring tracks $BL_{hx}$ and $BL_{vx}$ that are used for internal wiring.

From these input data, the method produces in each iterative step the CIRCUIT PLACEMENT and the GLOBAL WIRING for the cell structure existing at that level, as was outlined above and will be described in more detail below.

(A3) Survey of Method Steps

For any level in the partitioning hierarchy, the following steps are executed by the present method:
(a) All existing cells (i.e., supercells) are bisected in a direction perpendicular to the last partitioning so that two new cells are obtained from each old cell.
(b) The network that was assigned to each cell is also partitioned into two parts, and the resulting two subsets of circuits/components are assigned to the respective two new cells.
(c) A placeability analysis is made to determine for each subset whether its circuits can be accommodated in the assigned new cell (considering their different shapes and their legal positions existing in that cell).
(d) For each subnetwork of the total wiring network it is determined through which of the new cells it passes.
(e) For each subnetwork an optimal wiring track through the respective cells is determined. This is done by separating the set of cells through which the subnetwork passes into cell groups consisting of a rectangular array of $2 \times n$ cells, and to apply a specific wiring procedure for each such cell group.

(A4) Illustration of Cell Partitioning and Subnet Involvement

Figure 2:
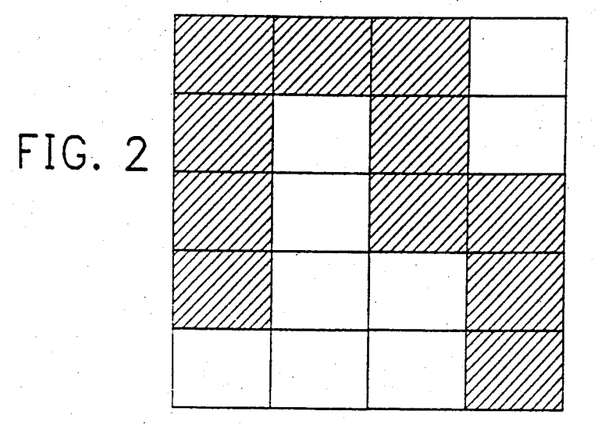
FIG. 2 is a schematic illustration of a chip area subdivided into supercells of which those are marked through which an assumed net passes at a certain level of hierarchy.
Figure 3:
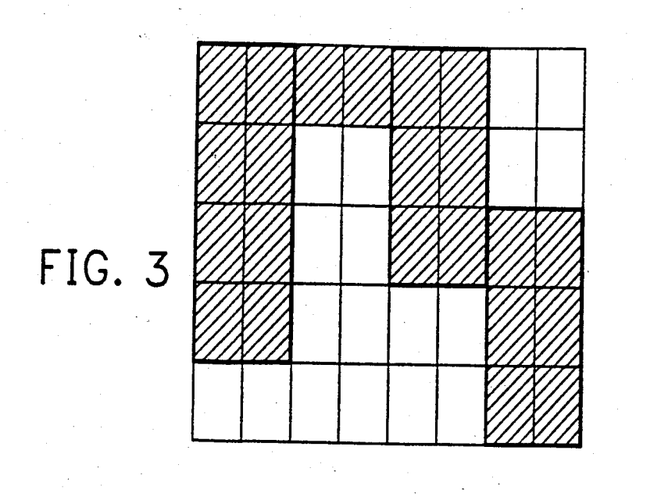
FIG. 3 shows the chip surface of FIG. 2 after the next partitioning step bisecting each supercell and indicates how cell groups of shape 2×n can be formed of the marked cells through which the assumed net passes.
Figure 4:
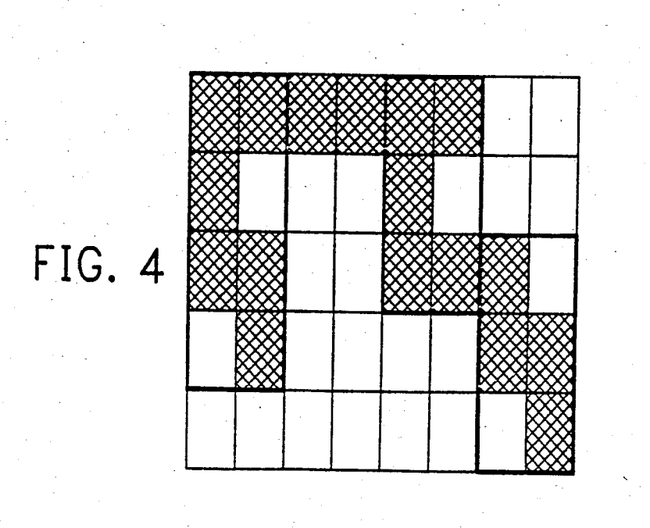
FIG. 4 shows a revised version of FIG. 3 in which only those cells of the new cell pairs are marked through which the assumed net actually passes (as a result of 2×n routing).

In FIGS. 2, 3 and 4 a rectangular cell array (chip surface) is shown on the k-th (FIG. 2) and (k+1)-th level of partitioning. Each of the supercells of FIG. 2 is bisected by a vertical line to obtain the new cells of FIG. 3/FIG. 4. The cells that are marked in FIG. 2 are those through which one specific subnetwork passes. FIG. 3 shows how these cells, after the partitioning step, can be subdivided into rectangular cell groups of $2 \times n$ cells for simplifying the wiring procedure. FIG. 4 illustrates that after partitioning, in some of the new cell pairs (each obtained from one old cell) the subnetwork passes only through one of the cells but does not touch the other one. This fact is considered in the wiring procedure.

(B) DETAILS OF METHOD STEPS

Some more details are given in the following for the different steps that are executed on each level of the partitioning process, as outlined above.

(B1) Partitioning of Cell Array and of Network

The design process deals with a hierarchy of chip subdivisions. Each of the subdivisions defines a grid of supercells. Initially we start with 0-subdivision G0 which is a $1 \times 1$-grid and is identical to the initial substrate. G1 is a $1 \times 2$ grid and is a result of the first cut of G0. Without loss of generality one can assume that $g \geq p$ and that the first cut is in vertical direction. The size of G1(1,1) is $p \times \lfloor p/2 \rfloor$, the size of G1(1,2) is $p \times \lceil q/2 \rceil$[(using these notations for floor and ceiling respectively). G2 is a grid which is the result of ($\lceil p/2 \rceil / \lfloor p/2 \rfloor$)—horizontal cut of G1, and so on. Last subdivision GL is identical to the whole cell array G and is of size ($p \times q$).

Figure 5:
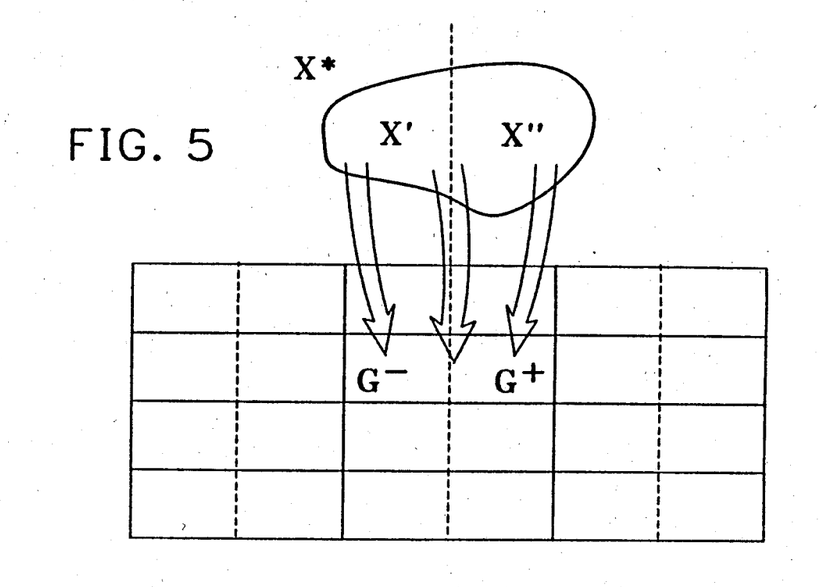
FIG. 5 is a schematic diagram showing the bisecting of a cell and the partitioning of the related component set into assignable subset.

Suppose that the wiring on the k-th level of hierarchy is completed. At this time each supercell Gk(i,j) has a certain subset X* of the set of circuits assigned to it. It was assured (by the previous partitioning step) that the set X* is placeable on Gk(i,j) which is now dissected. The next operation is to partition X* into two disjoint sets X' and to X" and to assign those sets to the resulting pieces of Gk(i,j), which will be denoted by $G^-$ and $G^+$. See FIG. 5 for illustration.

The resulting partition $X^* = X' \cup X''$ must satisfy the following two conditions:
(1) X' must be placeable on $G^-$, X" must be placeable on $G^+$.
(2) The number of subnetwork wires or nets that are supposed to cross the newly established boundary between $G^-$ and $G^+$ must not exceed the number of available wiring tracks, crossing this boundary.

To get this partition the following heuristic procedure is applied for consecutively constructing the subsets X' and X". Initially they are empty. $X^c$ denotes the complement of them: $X^c = X^* - (X' \cup X'')$. At a current step of the procedure it must be decided which of the two areas $G^-$ or $G^+$ (say $G^-$) has more cells available for assignment. Then from the list of $X^c$ the best candidate to join X' is selected.

The following criteria for candidate selection are used, e.g. for X' (in descending priorities; only in case when there are several candidates satisfying the first criteria the next one is used):
(a) Candidate must have a legal position on $G^-$.
(b) Candidate must have largest force to the left.

Note: The wiring on the previous level of hierarchy defined forces on candidates acting either to the left or to the right. Each net that used supercell Gk(i,j) for wiring and connected with the candidate will add a point to forces depending on whether it crossed left or right boundary of Gk(i,j). Also if Gk(i₁1,j) were already partitioned, circuits distributed there and connected with the candidate may add points to the forces.

(c) Number of nets connecting candidate with the components already accepted to X" is minimal.

(d) Number of admissable locations in G⁻ for the candidate is maximal.

After the sets X' and X" are constructed the number of subnetwork wires crossing the new boundary is compared with the number of available wiring tracks. One may perform a pairwise interchange routine to reduce the number of dissected subnets.

It should be noted that one can calculate the number of available wiring tracks only at the final level of hierarchy. At the intermediate levels, while circuits are not placed, one can only use heuristic estimates of the numbers of tracks averaging the numbers of blocked tracks from BL matrices for cells situated along the cut-boundary.

Figure 6:
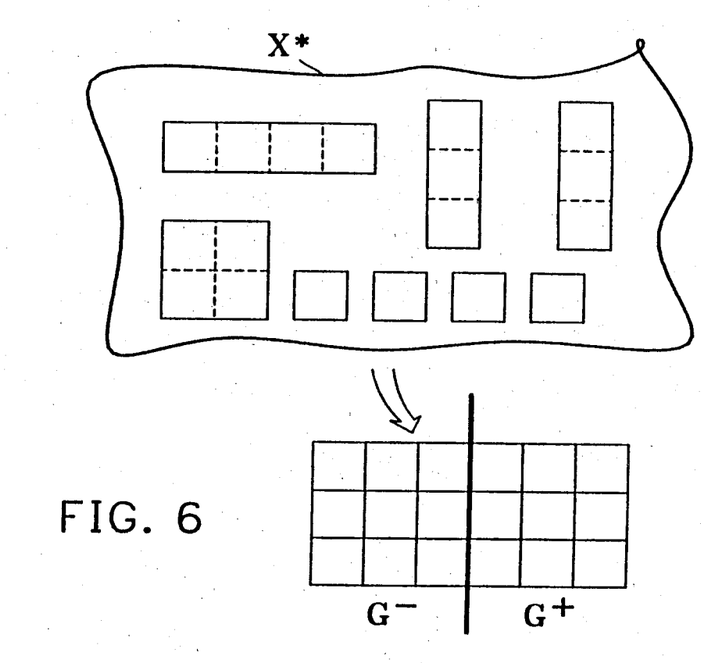
FIG. 6 is a diagram illustrating a placeability problem when a cell is divided.

Some remarks should be made on the two conditions for partioning the set X* of circuits into two subsets. Condition (1) is mandatory. If one of the assignments turns out to be non-placeable, there are two alternatives: (a) changing the partition; and (b) applying the matching of circuits from the previous level:. X* was initially placeable on Gk(i,j); this matching can be taken for the next level but in this case some multicell circuits may be dissected by the new boundary. An example of this situation is given in FIG. 6.

Condition (2) may not be mandatory. This depends on the level of hierarchy. It is clearly mandatory at the very first cut. On lower levels of hierarchy, however, one may allow condition (2) to be slightly violated. This may lead to overflow during an intermediate wiring stage, but finally overflowed subnets may choose an alternative route by a wave propagation procedure.

(B2) Placeability Analysis

After each subdivision of the chip and the corresponding partitioning of the network, it must be determined whether the restrictions on placeability imposed by the legal position matrices (LP) prohibit a legal placement. In this section a procedure is presented that determines whether all these assignments are admissible, i.e. that they may eventually lead to a legal placement.

Suppose supercell Gk(i;j) is being processed and X* is the set of circuits that have been assigned to it.

(1) In the case when for every x of X* the shape function $sh(x)=(1,1)$, i.e. when each circuit uses not more than a single elementary cell one can use a procedure by Hopcroft-Karp to test for the existence of a perfect matching. This procedure which was published in the SIAM Journal of Computing, 1973, pp. 225-231 finds the maximum matching for a bipartite graph requiring only $O((M+N) \times N^2)$ steps, where M is the number of edges and N is the number of vertices. The corresponding graph is defined as follows. Let C denote the set of elementary cells c of Gk(i;j) and let U denote the set of pairs $U=[x,c]$ where each x is an element of X* and c is a legal position cell for x. Now, the matching problem is reduced to finding whether a perfect matching exists for bipartite graph $\Gamma=(x^*,c,U)$.

(2) If the above condition does not hold, i.e. if some of the circuits are multi-cell circuits, the placeability problem cannot be reduced to matchings in bipartite graphs. As the circuits of X* can be single-cell circuits or multi-cell circuits, they are divided into two disjoint sets: A set XS comprising all single-cell circuits, and a set XM comprising all multi-cell circuits.

The nontrivial part of the placeability analysis is the matching of the multi-cell circuits. This problem can be greatly simplified by using the notion of "book-type".

Circuits of the logic network are partitioned into books. Circuits of the same book are of identical physical nature (they are of the same part-number). They have identical sets of legal positions on a chip, i.e. if the circuits x and y are of the same book-type, then $LP(x)=LP(y)$ and $sh(x)=sh(y)$. This also means, that circuits x and y are interchangeable.

Suppose that there are r different multiple-cell books B(1), B(2) ... B(r). The circuits of XM are partitioned into disjoint sets X(1), X(2) ... X(r) where X(i) is a set of multicell circuits of book B(i). Naturally, circuits from the same book have the same shape, so it is conceivable to speak about the shape sh(B(i)).

It is also assumed that the books are ordered according to size, i.e. if $i>j$ then $sh(B(i))>sh(B(j))$.

The matching procedure is an exhaustive search for a matching of XM organized into a backtracking scheme with the subsequent matching testing of XS by the Hopcroft-Karp procedure mentioned above.

Let VP be a boolean vector where every element corresponds to a different elementary cell in Gk(i,j). If $VP[p]=TRUE$ then the corresponding cell is considered to be occupied. If $VP[p]=FALSE$ then the corresponding cell is considered to be free for placement.

Let P(i) denote the placement vector for $X(i)=[x(i,1), x(i,2), \ldots, x(i,k)]$; P(i) has length equal to k and each element of P(i) corresponds to a cell belonging to C. If $P(i)[j]=c$, then the top left corner of circuit x(i,j) is placed in cell c.

Define the placement function PLC(VP,P(i)) which finds the "next" placement vector for book B(i). Its value $NP(i)=PLC(VP,P(i))$ returns a placement vector which has the three following properties.

(1) If the circuits belonging to X(i) are placed at the locations indicated by NP(i), then these circuits will only occupy unused cells (unused cells are indicated by the valid positions vector VP) and two circuits belonging to X(i) will not occupy the same cell.

(2) NP(i) must be in ascending order: If $(j>k)$ then $NP(i)[j]>NP(i)[k]$.

(3) Using a lexicographical ordering, NP(i) must be the "smallest" placement vector with properties (1) and (2) which is also "less than" P(i).

If a new placement vector with all three properties can not be found, then PLC(VP,P(i)) returns a vector with all zeros.

HKA(VP,XS) denotes the boolean function which uses the Hopcroft-Karp procedure to determine whether a perfect matching can be found between the circuits XS and the unused cells (indicated by VP).

REM(VP,P(i)) is the function that sets VP to indicate that the cells belonging to P(i) are unused.

ADD(VP,P(i)) is the function that sets VP to indicate that the cells belonging to P(i) are used.

The following APL procedure, using the above defined functions, describes the necessary steps for completing the placeability analysis.

(1) Set VP to all zeroes;
(2) FOR [j=1] TO [r] DO: Set P(i) to all zeroes];
(3) Set [i:=1];
(4) Set [VP:=REM(VP,P(i))];
(5) IF [i=r+1[GOTO (12);
(6) Set [P(i):=PLC(VP,P(i))];
(7) IF [P(i)=0] GOTO (10);

(8) Set [VP:=ADD(VP,P(i))];
(9) Set [i:=i+1] AND GOTO (4);
(10) Set [i:=i−1];
(11) If [i>0] THEN GOTO (4), ELSE EXIT: matching does not exist;
(12) IF [HKA(VP,XS)=TRUE] THEN EXIT: matching has been found, ELSE GOTO (10).

Figure 7:
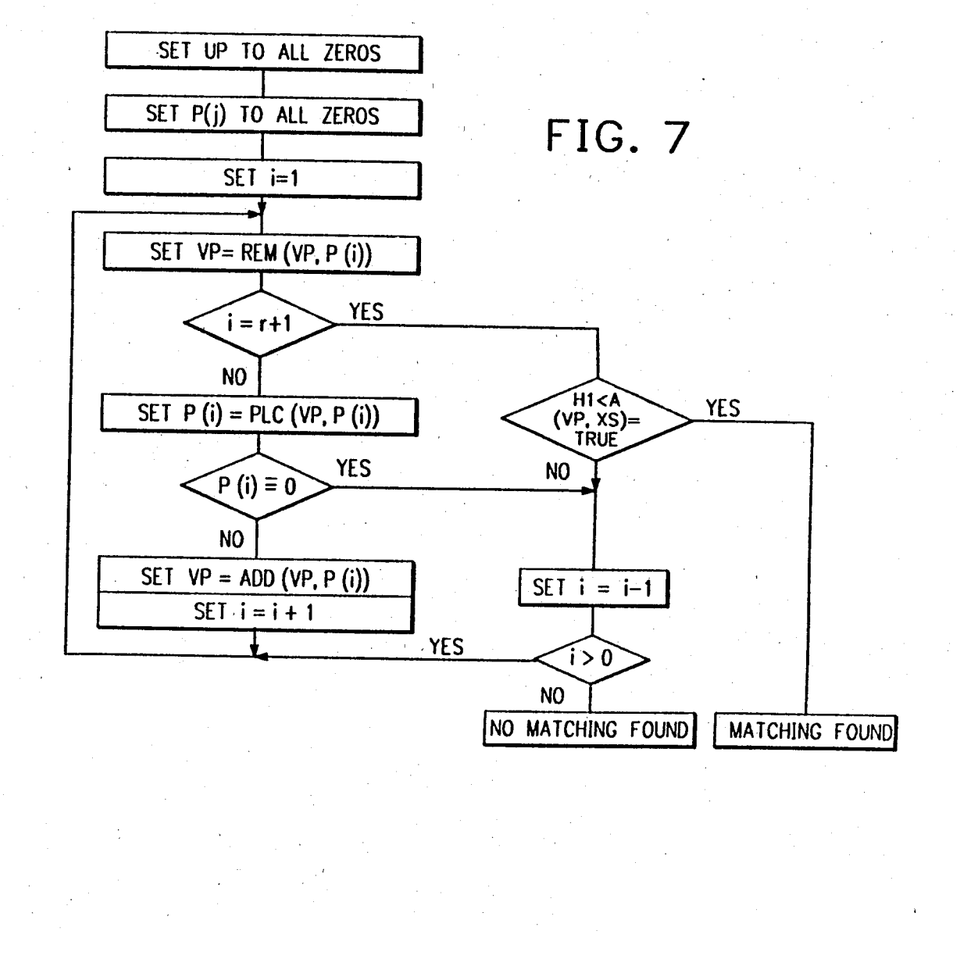
FIG. 7 is a flow diagram of the procedure for placeability analysis.

A flow diagram of this procedure is shown in FIG. 7.

The above described backtracking procedure has exponential worst case run time. But, due to the nature of placeability restrictions, worst case examples are only encountered at very low levels of hierarchy when there is a small number of circuits and cells to be matched. When the number of circuits is large, the number of candidate locations LP is also large; therefore many matchings exist and one such matching is usually found after the very first walk through the search tree in the backtracking scheme. It turns out that complete search for matchings becomes necessary when the matching problem itself is so small that even exhaustive search terminates quickly. (In experiments that were performed, the largest case requiring complete search was when 10 circuits were to be matched into 16 cells).

(B3) Wire allocation within Cell Groups of Dimension 2×n

As was mentioned in section (A3) above, the set of cells associated with a subnet can be subdivided for the wiring process into areas or cell groups which are 2 cells wide and n cells long. For such cell groups, the wiring part of the layout design is reduced to a relatively simple case, i.e. to wiring within a 2×n grid.

The 2×n wiring procedure finds the minimal cost tree interconnecting a set of elements located on a 2×n grid. The input for the procedure consists of (a) The locations of the elements on the 2×n grid:
EL is a 2×n boolean matrix; if EL [i;j]=TRUE than the corresponding cell contains an element.
Note: it is assumed that (EL [1,1] v EL [2,1]=TRUE), and (EL [1,n] v EL [2,n]=TRUE.
(b) The barrier costs:
(1) VC is an N element vector which stores the vertical barrier costs; VC(j) indicates the cost that must be added if a wire crosses between cell G(1,j) and cell G(2,j).
(2) HC is a 2×(n−1) matrix that stores the horizontal barrier costs; HC(i,j) indicates the cost which must be added if a wire crosses the boundary between cell G(i,j) and cell G(i,j+1).

Note: if the barrier cost is greater than a predetermined large number, the corresponding barrier is blocked and a wire can not pass through this cell boundary.

Matrices VC and HC represent the cost-functions. They reflect the channel capacity and via conditions of a cell and its boundary. Clearly, HC(i,j) must be a decreasing function of the number of wiring tracks crossing the boundary between cells G(i,j) and G(i,j+1). VC(j) must also be a decreasing function of the number of tracks crossing the boundary between cells G(1,j) and G(2,j), but the setting of VC reflects a "via cost", because if a wire crosses this boundary, then it definitly bends in one or both of the cells G(1,j) and G(2,j). Values of VC and HC must be selected. The choice to be made may be based on the results of a series of experiments with randomly generated 2×n wiring problems. A good choice is to set $HC(i,j)=1CP(i,j)$, where $CP(i,j)$ is the number of free wiring tracks crossing the boundary between cells $G(1,j)$ and $G(2,j)$, and $VC(j)=(1/CP(j))+V^{-\frac{1}{2}}$ where $CP(j)$ is the number of available wiring tracks between cells $G(1,j)$ and $G(2,j)$, V is the maximal number of vias that can be placed in one of the cells $G(1,j)$ or $G(2,j)$. This number can be determined in accordance with the method set forth in the publication by D. T. Lee et al: "Number of Vias: A Control Parameter for Global Wiring of High-Density Chips", IBM Journal of Research and Development, Vol. 25, No. 4, 1981, pp. 261–271.

Note: The description in this section is intended for cases where the longitudinal extension of the 2×n cell group is in the horizontal direction. The procedure is of course also applicable to cell groups having their longitudinal extension in the vertical direction, such as those shown in FIGS. 3 and 4. For these cases, the terms "horizontal" and "vertical" must be interchanged in the present section.

The result of the 2×n wiring procedure is a description of the minimal interconnection tree or an indication that a tree cannot be found.

The 2×n wiring procedure is a modification of a procedure published in 1977 in "Networks" which finds a Steiner tree that interconnects a set of elements located on a 2×n grid (A. V. Aho et al: Rectilinear Steiner Trees: Efficient Special-Case Algorithms. Networks, Vol. 7, 1977, pp. 37–58). The procedure suggested here solves the problem for arbitrary cost-function associated with crossing a boundary (matrices VC and HC) whereas the earlier published procedure assumes all these costs to be equal to 1.

In order to illustrate the 2×n wiring procedure, we need the following notations:

(a) $T_1(n)$ denotes the minimal cost tree which interconnects all elements located in cells G(i,j) with j>n, and in cell G(1,n).
(b) $T_2(n)$ denotes the minimal cost tree which interconnects all elements located in cells G(i,j) with j>n, and in cell G(2,n).
(c) $T_3(n)$ denotes the minimal cost tree which interconnects all elements located in cells G(i,j) with j<n, and in cells G(1,n) and G(2,n).
(d) $T_4(n)$ denotes the minimal cost forest, consisting of two different trees T′ and T″: T′ uses cell G(1,n), T″ uses cell G(2,n) and the set of elements located in cells G(i,j) with j<n is interconnected by either one of them (this means that the trees have to be joined later).
(e) $EX_j$ is a four element boolean vector; $EX_j[z]$ FALSE indicates that $T_z(j)$ cannot be used (z=1, 2, 3, 4).
(f) $CST_j$ is a four element vector; $CST_j[z]$ stores the cost of $T_z(j)$, (z=1, 2, 3, 4).

The following is an APL procedure for determining the minimal cost wiring tree for a 2×n cell group:

(1) Compute $T_1(1)$, $T_2(1)$, $T_3(1)$, $T_4(1)$; Compute $Ex_1$ and $CST_1$;
(2) Set [j:=2];
(3) Compute $T_1(j)$, $T_2(j)$, $T_3(j)$, $T_4(j)$; Compute corresponding $EX_j$ and $CST_j$;
(4) Set [j:=j+1];
(5) IF [j≧n] THEN GOTO (3);
(6) If [(EL[1,N]=TRUE) ∧ (EL [2,N]=FALSE) ∧ (EX$_N$[1]=TRUE)] THEN EXIT and indicate that the minimal cost tree is equal to $T_1(N)$.
(7) IF [(EL [1,N]=FALSE ∧ (EL [2,N]=TRUE) ∧ (EX$_N$[2]=TRUE)] THEN EXIT and indicate that the minimal cost tree is equal to $T_2(N)$.

(8) IF [(EL [1,N]=TRUE) ∧ (EX$_N$[3]=TRUE)] THEN EXIT and indicate that the minimal cost tree is equal to T$_3$(N).

(9) EXIT and indicate that a interconnection tree does not exist.

Figure 8:
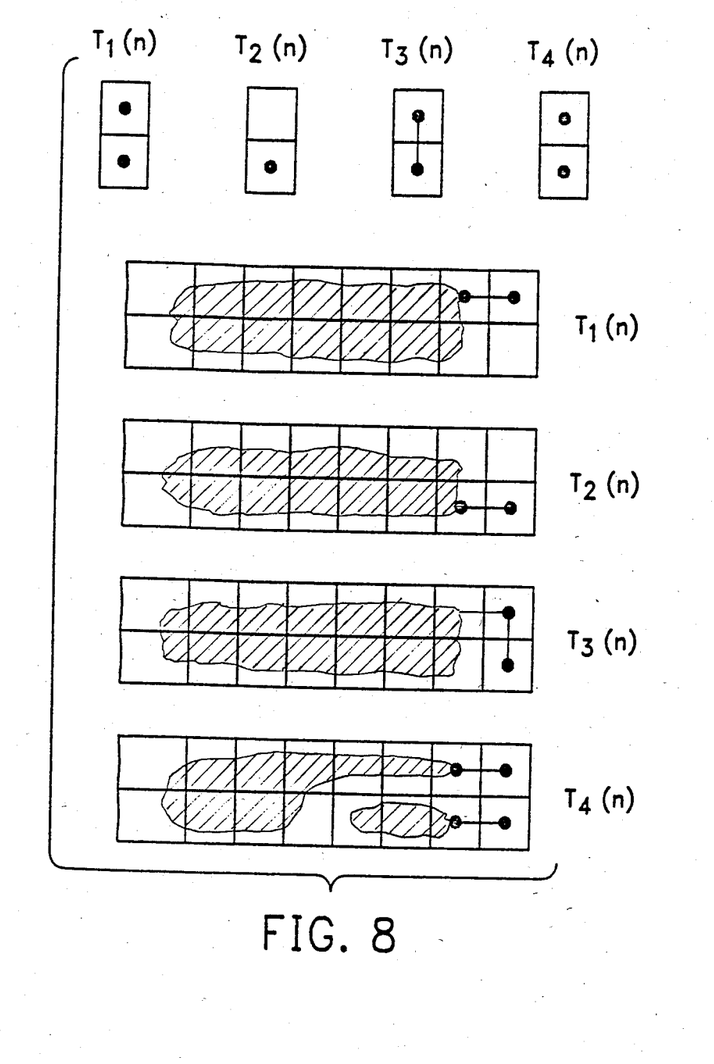
FIG. 8 is a schematic illustration of the 2×n wiring procedure.

The action of this procedure is illustrated in FIG. 8. A similar 2×n routing algorithm was used by the authors to solve "Channel Routing Problem" (M. Burstein, R. Pelavin, Hierarchics/Channel Router, Integration, Vol. 1, No. 1, 1983, also in Proceedings of 20th DA Conference, Miami Beach, 1983).

Figures 9, 92:
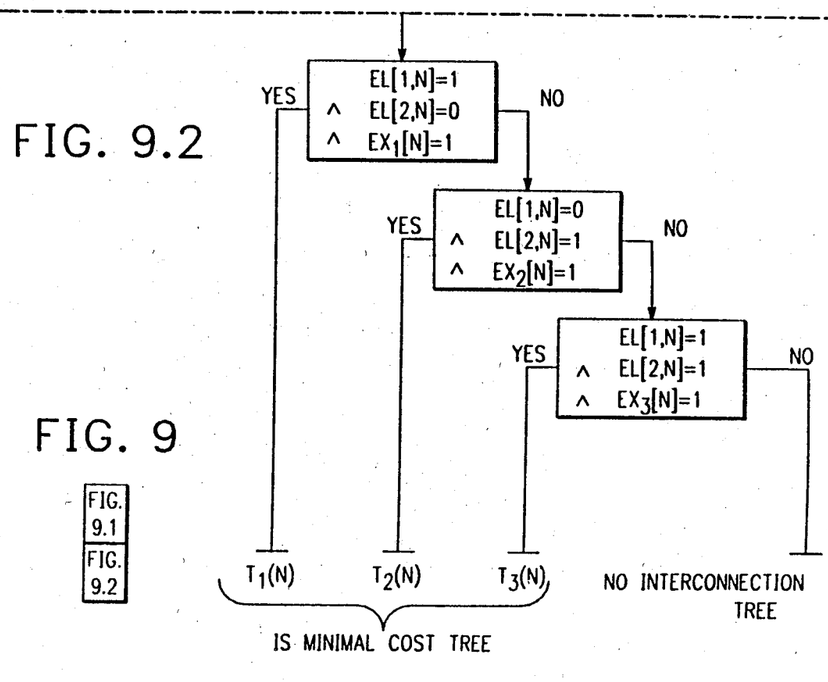

A flow diagram of this procedure is shown in FIG. 9.

If a wiring tree within an area does not exist, the subnetwork involved can be embedded using at the respective level of the partitioning hierarchy a wave propagation technique which is described in "A Physical Design Machine" by S. J. Hong et al., published in Proceedings International Conference VLSI-81, Edinburgh, August 1981, pp. 267 ff. (This publication is mentioned in the BACKGROUND).

(C) RESULTS AND ADVANTAGES

The above described new design method was tested on masterslice chip examples with circuits up to 800. In this range the time required to complete placement and global wiring on average can be expressed by $T=0.415 \times n^{1.1}$ (seconds) on an IBM System/370/168 (where n is the number of circuits).

Results of experiments, comparing this technique with traditional placement and wiring methodology, showed considerable reduction in overflow net count, total wirelength, and execution time.

The following Table 1 presents the result of several experiments performed with randomly generated logic networks with number of circuits ranging from 100 to 350 and number of subnets being equal to 105% of the number of circuits. Subnets were represented by subsets of the set of circuits. Net-size (number of terminals) ranged from 2 to 12. The circuits were all single-cell and (for simplicity reasons) blocked the same number of vertical and horizontal tracks. In Table 1, HPW refers to the present method, whereas OLD refers to a layout obtained by a placement procedure as described in the Breuer article initially mentioned and by a global wiring procedure as described in the above-mentioned Hong et al. paper, with 'zero detour limit'.

Figure 10A:
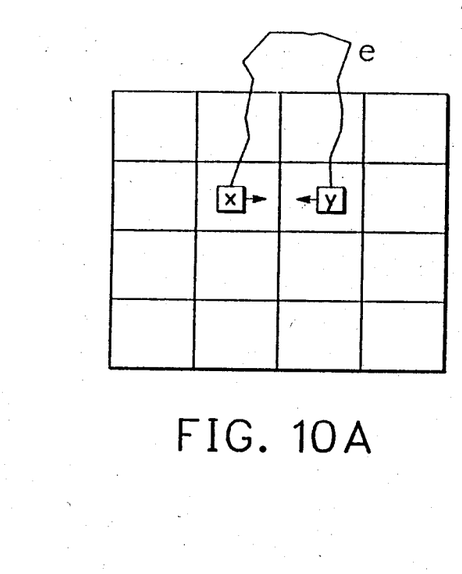
FIGS. 10A and 10B illustrate the different forces acting between two components on different sides of a boundary, in dependence on the placement/wiring method used.
Figure 10B:
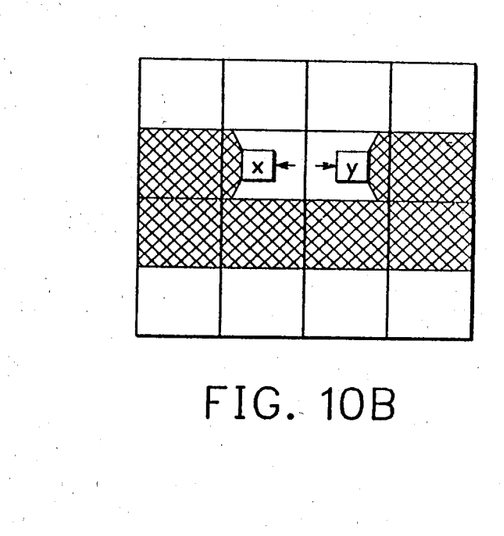
Figure 91:
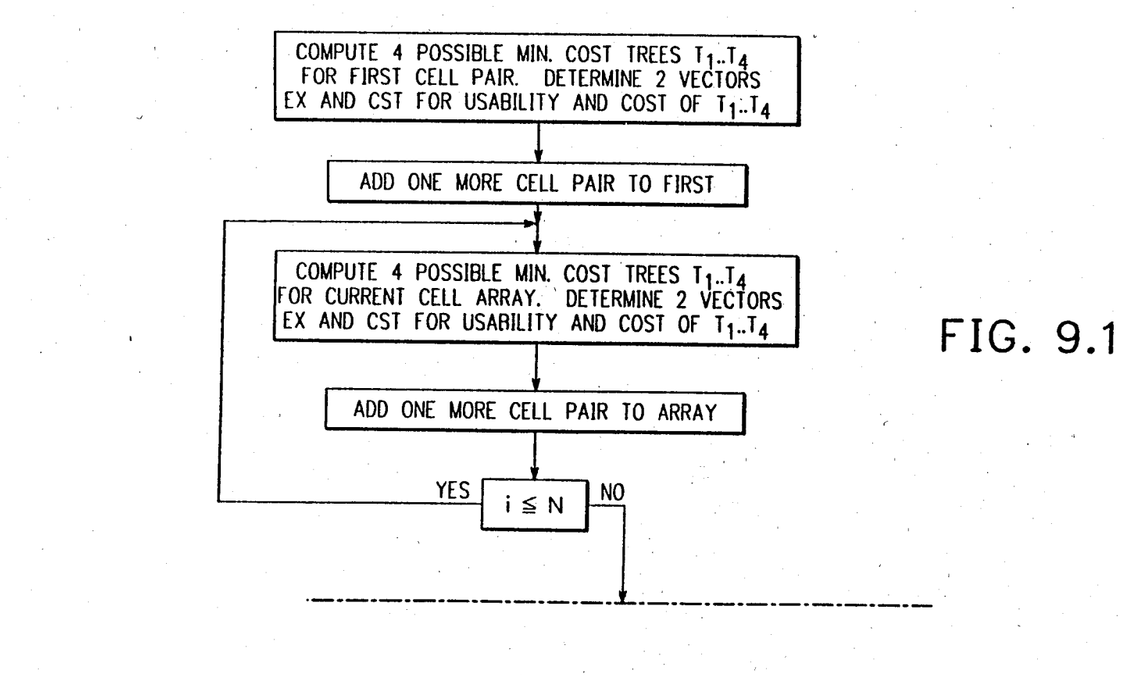

Several reasons explain this better performance. First, it is unlikely that the final placement obtainable by the present invention can be achieved by any sole placement program. Placement by the above-described new method very much depends on the wiring of the previous levels of the hierarchy. Despite its similarity with some known placement methods, placement resulting from the new method suggested by the present invention can be completely different from resulting placements of known methods. One of the examples is presented in FIG. 10. We consider two components x and y connected by a 2-terminal subnet e. In all conventional placement procedures this subnet will contribute to a force of attraction between x and y (FIG. 10A). But the proposed new method treats e not just like an abstract net; this net may be wired on previous levels of hierarchy and it could take a certain detour because of the limited channel capacities. It may look like FIG. 10B. In that case this subnet will contribute to a force of repulsion between x and y.

TABLE 1

Results of several experiments

| Number of Example | Method | Number of Circuits | Array Size | Overflow Count | Wire Length |
|---|---|---|---|---|---|
| 1 | | 100 | 10/13 | | |
| | HPW | | | 0 | 586 |
| | OLD | | | 5 | 656 |
| 2 | | 150 | 11/16 | | |
| | HPW | | | 3 | 815 |
| | OLD | | | 11 | 890 |
| 3 | | 200 | 13/17 | | |
| | HPW | | | 0 | 1095 |
| | OLD | | | 4 | 1196 |
| 4 | | 250 | 15/20 | | |
| | HPW | | | 10 | 1330 |
| | OLD | | | 23 | 1396 |
| 5 | | 300 | 17/22 | | |
| | HPW | | | 1 | 1899 |
| | OLD | | | 4 | 2188 |
| 6 | | 350 | 18/24 | | |
| | HPW | | | 0 | 2156 |
| | OLD | | | 14 | 2378 |

Thus, while the invention has been described with reference to a preferred embodiment thereof showing the best mode known to the inventors, it will be understood by those skilled in the art that various changes in form and detail may be made without departing from the spirit or scope of the invention.

Having thus described our invention what we claim as new and desire to secure by Letters Patent is:

1. A computerized integral method for automatically placing components of a logic network and determining the wiring connections of a wiring network to them on a master-slice VLSI chip, comprising the steps of:
   (a) dividing the chip area into first and second portions constituting a first and a second cell, and
   (b) partitioning the logic network into first and second portions comprising, respectively, a first and a second subset of the components of the logic network, and assigning each of the component subsets to one of the cells; and
      repeating said dividing and partitioning steps (a) and (b) for each of said cells and assigned component subsets forming subsets of cells with assigned component subsets on successive levels, until an elementary cell resolution is obtained;
      wherein the improvement comprises including after each iteration of executing said steps (a) and (b) the additional steps of:
   (c) performing a placeability analysis to determine whether all components of a component subset can be placed in the assigned cell subset;
   (d) determining which subnetworks of said wiring network cross newly generated cell boundaries;
   (e) determining for each subnetwork the global wiring for the subset of cells through which the subnetwork passes, so that after the final iteration step leading to elementary cell resolution, component placement and global wiring are complete.

2. Method in accordance with claim 1, wherein said placeability analysis step utilizes a shape function sh(x) for each of the components x to be placed, said shape function defining for each component x the rectangular area consisting of a single elementary cell or of a plurality of elementary cells, that is required for accommodating the respective component.

3. Method in accordance with claim 2, wherein the placeability analysis step further utilizes legal position data LP(x) for each of the components x to be placed, said legal position data defining the set of elementary cells on which the respective component, or a given portion of it, can be placed.

4. Method in accordance with claim 1, wherein said global wiring step (e) comprises for each subnetwork, subdividing the subset of cells through which the respective subnetwork passes into rectangular cell groups which are two cells wide, and executing a partial wiring procedure for each such cell group to obtain the global wiring on the respective partitioning level.

5. Method in accordance with claim 4, wherein said global wiring step comprises for a cell group consisting of a 2×n cell array, first determining the wiring for a single cell pair, and then extending the determination to include a further cell pair in each of a plurality of steps, until all cell pairs of the cell group are included.

6. Method in accordance with claim 1, wherein the initial data for the placement and wiring procedures comprise a net list including the set X of components to be placed and the set of subnetworks to be formed, defining for each subnetwork the components assigned to the subset of cells through which it passes.

7. Method in accordance with claim 6, wherein the initial data for the partitioning and assigning step comprise placement data including, for each component x to be placed, a shape function sh(x) defining how many elementary cells in a rectangular array are required for placing the component; a list LP(x) of the set of elementary cells which can serve as a legal position for the respective component; and two values BLhx and BLvx indicating the numbers of horizontal and vertical wiring tracks which will be blocked in an assigned cell due to internal wiring of the component.

8. Method in accordance with claim 7, wherein said initial partitioning and assigning data further comprise as substrate data the numbers p and q of elementary cells in the horizontal and vertical directions, and the numbers h(i) and v(j) of available wiring tracks for each cell row and cell column.

9. A computerized system for automatically placing components of a logic network on a master-slice VLSI chip and integrally globally determining the wiring connections of a wiring network to said components, comprising:
 means for determining the number of elementary cell rows and columns available on the area of said chip and the available wiring tracks per said rows and columns;
 assignment means for determining the set of components of said logic network to be placed and respectively assigning subsets thereof successively to a hierarchy of sets of said elementary cells;
 analysis means for performing a placeability analysis to determine whether all components of each said subset can be placed in the respective assigned cell set;
 wiring connection means for globally determining the wiring connections for subnetworks of said wiring network to the components within said subsets and over the wiring tracks between said subsets for each of said hierarchical sets of cells; and
 partitioning means for iteratively actuating said assignment means, said analysis means and said wiring connection means beginning with two sets of elementary cells and continuing by successively subdividing said sets of elementary cells through successive levels until the number of said cell sets equals said number of elementary cells, whereupon the component placement and global wiring are complete.

10. A system as in claim 9 further comprising means for providing an input to said analysis means to perform said placeability analysis, comprising a shape function sh(x) for each of the components x to be placed, said shape function defining for each component x the rectangular area consisting of the elementary cell or cells required for accommodating the respective component.

11. A system as in claim 10 wherein said input further comprises legal position data LP(x) for each of the components x to be placed, said legal position data defining the set of elementary cells on which the respective component, or a given portion of it, can be placed.

12. A system as in claim 10 wherein said partitioning means comprises means for subdividing the subset of cells to which the respective subnetwork is connected into rectangular cell groups which are two cells wide, and said wiring connection means comprises means for executing a partial wiring procedure for each such cell group to obtain the global wiring on the respective partitioning level.

13. A system as in claim 12 wherein said wiring connection means further comprises means for obtaining the global wiring for a cell group consisting of a 2×n cell array, comprising:
 means for first determining the wiring for a single cell pair; and
 means for then extending the determination to include a further cell pair in each of a plurality of steps, until all cell pairs of the cell group are included.

14. A system as in claim 9 further comprising means for providing an input to said assignment means and said wiring connection means to perform the placement and wiring procedures, comprising a net list including the set X of components to be placed and the set of subnetworks to be formed, defining for each subnetwork the components to which it is connected.

15. A system as in claim 14 wherein said input further comprises placement data including, for each component x to be placed, a shape function sh(x) defining how many elementary cells in a rectangular array are required for placing the component; a list LP(x) of the set of elementary cells which can serve as a legal position for the respective component; and two values BLhx and BLvx indicating the numbers of horizontal and vertical wiring tracks which will be blocked in an assigned cell due to internal wiring of the component.

16. A system as in claim 9 further comprising means for providing an input to said cell row and column determining means, comprising data indicating the numbers p and q of elementary cells in the horizontal and vertical directions, and the numbers h(i) and v(j) of available wiring tracks for each cell row and cell column.

* * * * *